United States Patent [19]

Bhuva et al.

[11] Patent Number: 5,047,672

[45] Date of Patent: Sep. 10, 1991

[54] ECL/TTL CONVERSION CIRCUIT AND TRANSLATION PROGRAMMABLE ARRAY LOGIC

[75] Inventors: Rohit L. Bhuva, Plano, Tex.; Walter C. Bonneau, Jr., Peoria, Ariz.; Robert L. Gruebel, Plano, Tex.; Robert A. Helmick, Allen, Tex.; Allen Y. Chen, Plano, Tex.

[73] Assignee: Texas Instruments Incorporated, Dallas, Tex.

[21] Appl. No.: 332,257

[22] Filed: Mar. 31, 1989

[51] Int. Cl.[5] ............... H03K 19/0175; H03K 19/20; H03K 17/16; G06F 7/38
[52] U.S. Cl. .................................. 307/475; 307/455; 307/456; 307/465; 307/443
[58] Field of Search ............... 307/475, 445, 455, 456, 307/465, 467, 443, 473

[56] References Cited

U.S. PATENT DOCUMENTS

| | | | |
|---|---|---|---|
| 4,527,079 | 7/1985 | Thompson | 307/475 |
| 4,644,194 | 2/1987 | Birrittella et al. | 307/475 |
| 4,677,320 | 6/1987 | Hannington | 307/475 |
| 4,758,746 | 7/1988 | Birkner et al. | 307/465 |
| 4,835,771 | 5/1989 | Moussie | 307/475 |
| 4,841,176 | 6/1989 | Millhollan et al. | 307/475 |

Primary Examiner—David Hudspeth
Assistant Examiner—Trong Phan
Attorney, Agent, or Firm—B. Peter Barndt; James T. Comfort; Melvin Sharp

[57] ABSTRACT

A circuit (90) converts a true ECL signal to a true TTL signal. The circuit includes a differential circuit (180) that receives an ECL signal having high and low values. The differential circuit produces a differential signal therefrom that has a high value in response to one of the high and low values of the true ECL signal, and a low value in response to the other of the high and low values of the true ECL signal. A first translator circuit (36, 64) has an input (32) coupled to the differential circuit (180). The first translator circuit (36, 64) transmits a true low TTL output (56) signal having a voltage level referenced to the voltage level of a TTL low supply voltage in response to receiving a high value of the differential signal. A second translator circuit (46, 52) has an input (38) and is coupled to a TTL high supply voltage and the output (56). An input signal appearing on the input (38) of the second translator circuit has a voltage level related to the voltage level of the differential signal (32). The second translator circuit (46, 52) transmits a high TTL output signal having a voltage level referenced to the voltage level of the TTL high supply voltage in response to the differential signal (32) being at a low value.

18 Claims, 2 Drawing Sheets

ECL/TTL CONVERSION CIRCUIT AND TRANSLATION PROGRAMMABLE ARRAY LOGIC

TECHNICAL FIELD OF THE INVENTION

The present invention relates in general to ECL to TTL conversion circuits, and more particularly to a method and circuit for converting a true ECL signal to a true TTL signal on one semiconductor chip, and a programmable array logic (PAL) chip having this feature.

BACKGROUND OF THE INVENTION

It has become apparent that emitter-coupled logic (ECL) is playing an increasing role in logic design. ECL is taking the form of gate arrays, translators, current/differential drivers, complex processors, programmable array logic (PAL) devices and "glue" logic. A general problem associated with the use of ECL is its communication to devices of the TTL logic family. As one example, ECL arrays are commonly connected to TTL memories commonly used in large or mainframe computer systems. Other examples include the connection of ECL circuits to TTL peripheral devices.

ECL to TTL voltage level translators have been previously devised. Conventional ECL to TTL voltage level translators are typified by U.S. Pat. No. 4,644,194 issued to M. Birrittella et al. While published as an ECL to TTL voltage level translator, this device actually only displaces the voltage level from an ECL signal, generally ranging from a low voltage of $-1.7$ volts to a high voltage of $-0.9$ volts, to a voltage of from 0.5 $V_{BE}$ to 1.5 $V_{BE}$, where $V_{BE}$ is the base-emitter voltage across an output bipolar transistor. The output signal derived from this circuit is not referenced to high and low TTL voltage supplies. Further processing of the output of this circuit would therefore be necessary before the signal could be used in TTL logic. A conversion circuit for converting a true ECL signal to a true TTL signal has yet been developed.

Conventionally, TTL or ECL "glue logic" is used to provide flexibility and design logic to provide mapping, decoding, general logic functions and synchronization. In many designs, it is not practical to include all electrical functions within a gate array or fixed logic device.

From the above, it can be seen that a need exists for a voltage level translation circuit that converts true input ECL voltage levels to a true TTL output signal. Further, a need exists for such a translation circuit in combination with an interfacing logic device.

SUMMARY OF THE INVENTION

One aspect of the invention is thus a circuit for converting a true ECL signal to a true TTL signal. The circuit has high and low TTL supply voltages and an input that receives a sequence of high and low ECL voltage levels as a true ECL signal. The circuit produces a true high TTL voltage level referenced to the level of the TTL high supply voltage in response to a selected one of the high and low voltage levels, and produces a low TTL voltage level referenced to the level of the TTL low supply voltage on the output in response to the other of high and low ECL voltage levels. In one embodiment, the circuit further includes a polarity switch for selecting one of the high and low true ECL voltage levels will be associated with one of the high and low true TTL voltage output levels.

In another aspect of the invention, the circuit includes a differential circuit that receives the true ECL signal and produces a differential signal having a high value and a low value. The high value is produced in response to one of the high and low ECL signal values, while the low value of the differential signal is produced in response to the other of high and low differential signal values. A first translator circuit receives the differential signal and transmits the low, true TTL output signal in response to the high value of the differential signal. A second translator circuit receives an input signal related to the differential signal. The second translator signal transmits the high, true TTL output signal in response to the differential signal being at the low value.

In another aspect of the invention, a programmable array logic circuit is provided that has a plurality of true ECL inputs and a plurality of logical true TTL outputs. The circuit includes a programmable array logic (PAL) matrix with a plurality of column conductors and a plurality of row conductors that are formed so as to intersect the column conductors. Each true ECL input is coupled to a respective one of the column conductors.

A plurality of boolean logic gate circuits each has inputs coupled to a respective group of the row conductors. The matrix is programmed by causing connections to be made at selected intersections of the row and column conductors. Logical outputs of the Boolean logic gate circuits are coupled to respective inputs of a plurality of true ECL/true TTL translation circuits. The logical ECL output signals derived from the PAL matrix are a sequence of high and low true ECL voltage levels. Each true ECL/true TTL translation circuit is operable to output a true TTL voltage signal having high and low TTL voltage levels that are translated from the high and low ECL signal levels.

A principal advantage of the present invention inheres in its ability to translate ECL voltage levels, typically ranging between $-0.9$ to $-1.7$ volts, to a true, TTL voltage signal having levels that are closely referred to a high TTL supply voltage level of, for example, $+5$ volts and a low TTL voltage level of, for example, zero volts. Hence, the circuit of the invention can provide a true TTL signal to circuitry connected to its output. Another advantage of the invention is the incorporation of this circuit into a programmable array logic circuit on one chip.

BRIEF DESCRIPTION OF THE DRAWINGS

Further aspects of the invention and their advantages will be discerned when the Detailed Description set forth below is read in conjunction with the drawings in which.

DETAILED DESCRIPTION OF THE INVENTION

Figure 1:
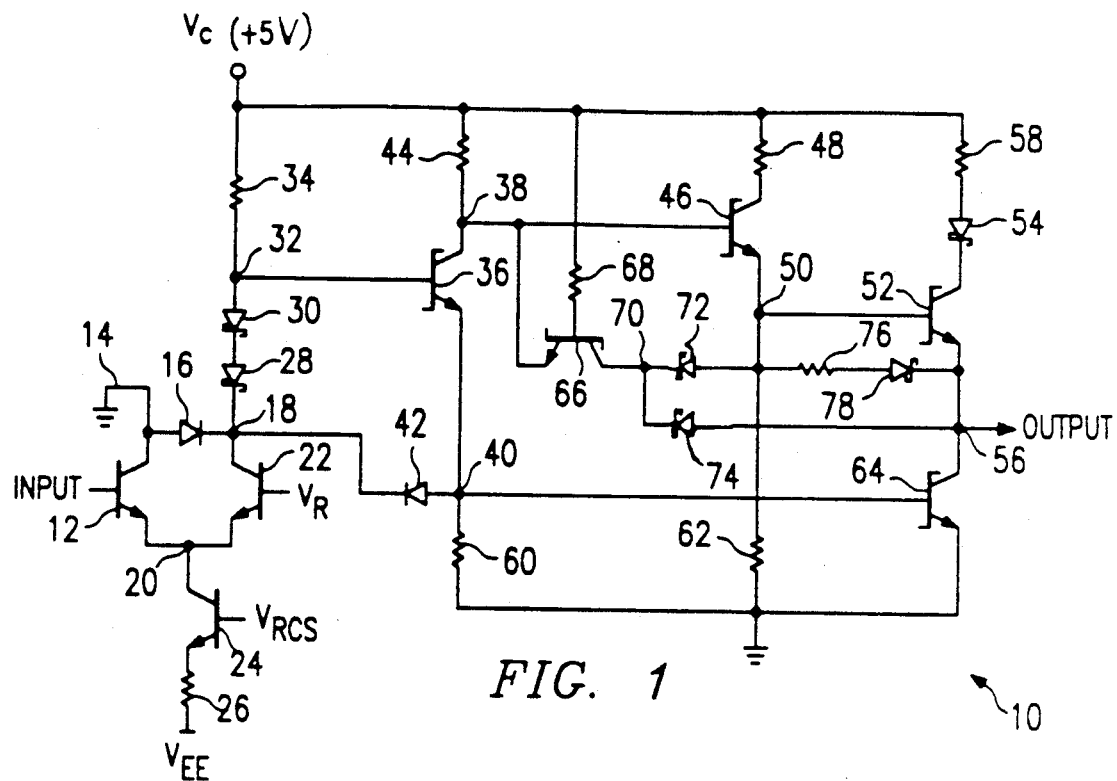
FIG. 1 is an electrical schematic circuit diagram of a first true ECL to true TTL conversion circuit according to the invention.

In the drawings, like characters refer to like components wherever possible. A true ECL/TTL conversion circuit is shown generally at 10 in FIG. 1. A true ECL input signal, which typically varies in a negative voltage range between $0-V_{BE}$ and $0-2V_{BE}$, is applied to the base of a bipolar npn transistor 12. A collector of transistor 12 is connected to a ground 14, which is representative of a true high ECL voltage source. The collector of transistor 12 is further connected to the anode of a diode 16. A cathode of the diode 16 is connected to a node 18. An emitter of the transistor 12 is connected to a node 20.

A bipolar npn transistor 22 has a base that is connected to a voltage reference ($V_R$), which is chosen to be half-way between the high and low levels of the true ECL signal input on the base of transistor 12. Typically, $V_R$ is chosen to be $0-1.5V_{BE}$. A collector of the reference transistor 22 is connected to node 18, while an emitter of transistor 22 is connected to node 20. A current source transistor 24 has a collector connected to node 20, an emitter connected to a first end of a resistor 26, and a base connected to $V_{RCS}$, which is a reference voltage designed to operate the transistor 24 in its linear region to sink a limited amount of current. A second end of the resistor 26 is connected to $V_{EE}$, which is preferably chosen as a substantial negative voltage, such as $-4.5$ volts or $-5.2$ volts.

A pair of Schottky diodes 28 and 30 are connected in series in a forward direction to provide a unidirectional path from a node 32 to node 18. Node 32 is further connected through a resistor 34 to a TTL supply voltage $V_C$, here shown as $+5$ volts. Node 32 is connected to the base of a Schottky-clamped bipolar npn transistor 36. A collector of transistor 36 is connected to a node 38, while an emitter thereof is connected to a node 40. The node 40 is connected to a anode of a diode 42. The cathode of diode 42 is connected to node 18.

The node 38 is connected to the TTL voltage supply $V_C$ by a resistor 44. Another Schottky-clamped bipolar npn transistor 46 has a base that is connected to the node 38, a collector connected to the TTL high supply voltage $V_C$ through a resistor 48, and an emitter connected to a node 50. The node 50 is connected to the base of a Schottky-clamped bipolar npn transistor 52, which has a collector connected to the cathode of a Schottky diode 54 and an emitter connected to an ECL/TTL translation circuit output node 56. The anode of the Schottky diode 54 is connected through a resistor 58 to the TTL high supply voltage $V_C$.

The node 40 is further connected through a resistor 60 to a TTL low supply voltage, here given as ground or zero volts. The TTL low voltage supply and the TTL high supply voltage can be any of various values, as long as $V_C$ is above the TTL low supply voltage by at least about five volts. Node 50 is connected to the TTL low supply voltage by a resistor 62. Node 40 is connected to the base of a Schottky-clamped bipolar npn transistor 64, which has a collector connected to the circuit output node 56 and an emitter connected to the TTL low supply voltage.

A Schottky-clamped bipolar npn speed-up transistor 66 has an emitter connected to node 38, a base connected to the TTL high supply voltage through a resistor 68, and a collector connected to a node 70. The node 50 is unidirectionally connected to the anode of a first Schottky diode 72, which in turn has a cathode connected to the node 70. The output node 56 is connected to an anode of a second Schottky diode 74, which in turn has a cathode connected to the node 70.

In operation, a true ECL signal that varies between $0-V_{BE}$ and $0-2V_{BE}$ is received on the base of the input transistor 12. The transistor 12 and the reference transistor 22 form a differential pair. If the true ECL voltage signal is high, the transistor 12 will be turned on and current will flow through the current source transistor 24 and resistor 26 to $V_{EE}$. Transistor 22 will not be appropriately biased and will therefore be turned off. A true high ECL voltage will exist at node 18, and therefore a high voltage will exist at node 32. Thus, a high differential signal will be applied to the base of the transistor 36. The diode 42 is provided for the speed-up of transient signal conditions.

If the true ECL signal is low, the input transistor 12 will be turned off and the reference transistor 22 will be turned on. Current will flow through the reference transistor 22, the current source transistor 24 and the resistor 26 to $V_{EE}$. This will cause a low voltage to appear at node 18 and thus also at node 32. A low differential signal will therefore be applied to the base of transistor 36, which will be turned off in response.

In the instance that a high differential signal is received at the base of the transistor 36, transistor 36 will conduct between its collector and emitter, and a high voltage will appear at the base of transistor 64 to render transistor 64 conductive. This in turn will sink current from the output node 56 to the TTL low supply voltage. The voltage at the output node will therefore in this condition be at 0 volts plus a $V_{CD}$ or $V_{ON}$ of the transistor 64, which is typically about 0.2 volts. As can be seen, the low output TTL signal will closely track the value of the TTL low supply voltage.

In the instance that a low differential signal is received at the base of the transistor 36, the voltage level at node 38 will stay high. This voltage is selected to properly turn on bipolar transistor 46. Transistor 46 will therefore conduct between its collector and emitter and cause a high voltage level to appear at node 50. The voltage at node 50 will in turn cause the transistor 52 to conduct, thereby bringing the output node 56 high.

The voltage dropped across resistor 44 is relatively small. Therefore, the high output voltage seen at output node 56 will approximately be $V_C - 2V_{BE}$, where one $V_{BE}$ is experienced across transistor 46 and the other $V_{BE}$ is seen across transistor 52. $V_{BE}$ for these transistors is typically about 0.8 volts. And therefore, the high, true TTL output signal will be approximately 3.4 volts. It can therefore be seen that the high, true TTL output voltage at node 56 will closely track the level of the high TTL supply voltage.

Viewed from another aspect, the transistors 36 and 64 form a first Darlington pair that are turned on by a high differential signal, while transistors 46 and 52 form a second Darlington pair that are turned on by a low differential signal appearing at the base of transistor 36. As can be seen, the input signal appearing at the base of the transistor 46 is the logic inverse of the differential signal appearing at the base of transistor 36. Therefore, in operation, either transistor pair 36, 64 or transistor pair 46, 52 will be turned on, with transistor pair 36, 64 pulling the output node 56 to a true TTL low voltage level ground and transistor pair 46, 52 pulling the output node up to a true TTL high voltage level.

Transistor 66 is provided to speed up the high-to-low transitions of nodes 50 and 56. When transistor 36 is turned on, node 38 goes low and turns off transistor 46. The voltage at node 50 will then begin to drop. The speed-up transistor 66 completes a current sinking path through diode 72, transistor 66, transistor 36 and resistor 60 to ground. High-to-low transitions on output node 56 are sped-up in a like manner through diode 74, transistor 66, transistor 36 and resistor 60.

The translation circuit shown in FIG. 1 turns a true high ECL voltage signal level into a true high TTL output signal. However, a user may wish to select an opposite convention where a true high ECL signal results in a true low TTL output signal. Such a selection is provided by the circuit shown generally at 90 in FIG. 2. Circuit 90 is identical in most respects to the circuit 10 shown in FIG. 1, except as indicated below. The ECL input signal "A" is input to a node 92. The node 92 is connected to a base of a bipolar npn transistor 94 as well as to the base of a bipolar transistor 96. A collector of transistor 94 is connected to a node 98, while a collector of the transistor 96 is connected to a ground or high ECL signal node 14. An emitter of the transistor 94 is connected to a node 100, while an emitter of transistor 96 is connected to a node 102.

A pair of bipolar npn reference transistors 104 and 106 have their respective bases connected in parallel to a reference voltage $V_R$. The emitter of the transistor 104 is connected to node 100, while the emitter of transistor 106 is connected to the node 102. A collector of transistor 106 is connected to node 98, which in turn is connected to the cathode of Schottky diode 28. A collector of the npn transistor 104 is connected to the ECL high supply voltage node 14.

A bipolar npn transistor 108 has its collector connected to the node 100, an emitter connected to a node 110 and a base connected to a node 112. Another bipolar npn transistor 114 has a collector connected to the node 102, its base connected to another reference voltage $V_{Rl}$, and its emitter connected to the node 110. A current source transistor 116 has a base thereof connected to $V_{RCS}$, a collector connected to the node 110 and an emitter connected through a resistor 118 to $V_{EE}$. Another bipolar npn current source transistor 120 has its collector connected to the node 112, a base connected to $V_{RCS}$ and its emitter connected through a resistor 122 to $V_{EE}$. A polarity input signal B is input to the base of a polarity transistor 124. The transistor 124 has its collector connected to an ECL high supply voltage 126 (here chosen as ground) and its emitter connected to the anode of a diode 128. The cathode of the diode 128 is connected to the node 112.

Transistors 94 and 104 form a first differential pair in which the ECL signal "A" is compared against $V_R$. In a like manner, transistors 96 and 106 form a second differential pair in which the same comparison is performed. However, the collectors of transistors 94 and 96 are connected differently, and the collectors of transistors 104 and 106 are connected differently in mirror image.

An ECL voltage polarity signal is fed into polarity input B. A high value of the ECL signal will turn the transistor 124 on, thus sinking current to the node 112 and turning on differential transistor 108. This in turn will enable the differential transistor pair 94 and 104. In this instance, a high ECL value on the input node 92 will be reflected as low differential signal values at nodes 98 and 32.

If a low voltage signal (such as −0.9 volts) is input on input "B," transistor 124 will be turned off and the node 112 will be close to $V_{EE}$. Transistor 108 will be turned off in favor of the reference transistor 114. This in turn will enable the differential transistor pair 96 and 106. A high ECL value at node 92 will turn on transistor 96 and will turn off transistor 106. Therefore, a high ECL value at node 92 will cause a high differential signal value to appear at node 32, and the resulting true TTL output at node 56 will be reversed from the previous case.

Figure 3:
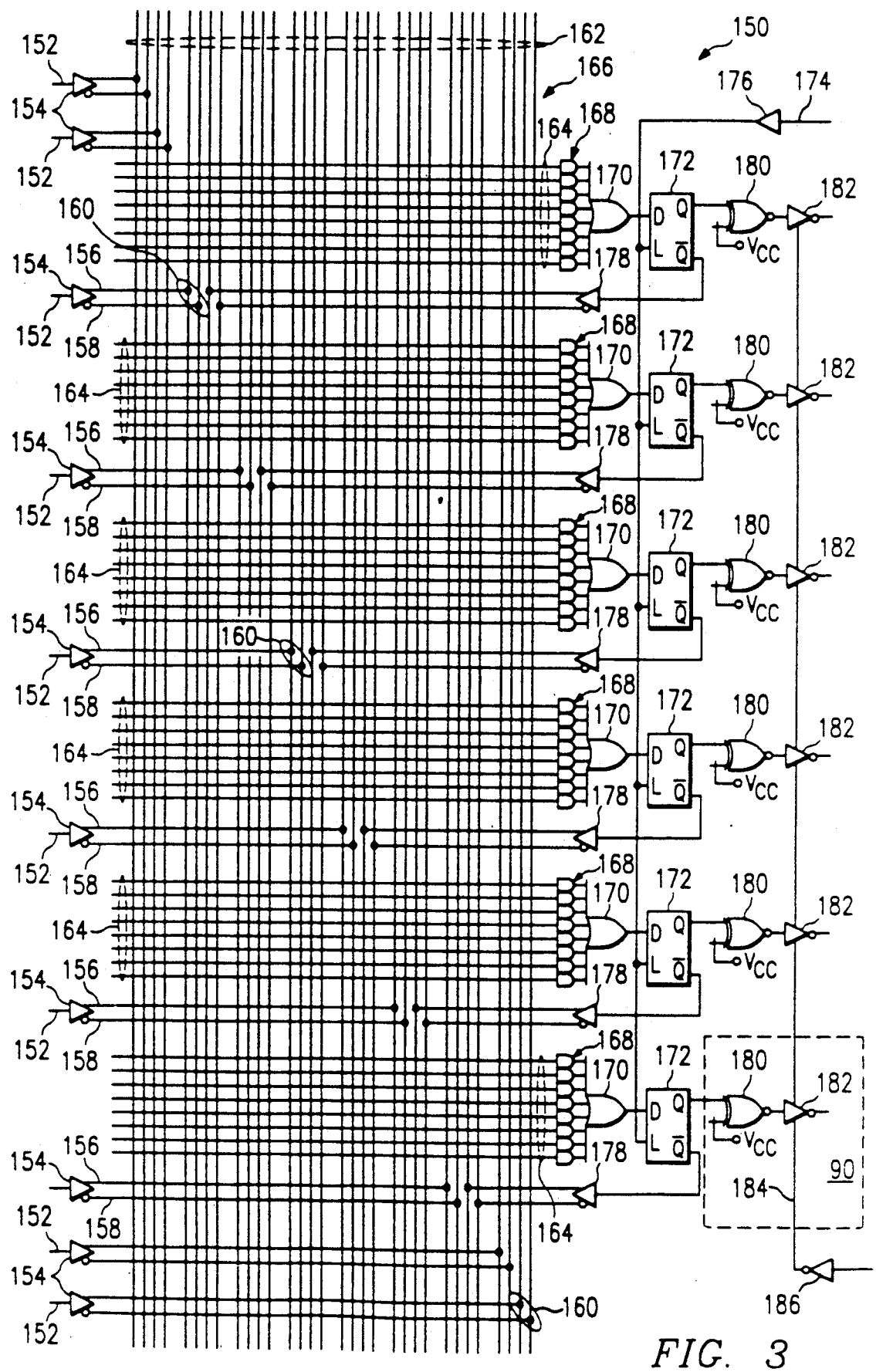
FIG. 3 is an electrical schematic circuit diagram of a combination programmable array logic (PAL) and translation circuit that provides a plurality of TTL outputs from a plurality of ECL inputs.

A combination programmable array logic and ECL/TTL translation circuit is shown generally at 150 in FIG. 3. A plurality of ECL inputs 152 are fed into respective buffers 154. Each buffer 154 has a true output 156 and a complement output 158. These are connected through respective connection points 160 to respective column conductors 162.

A plurality of row conductors 164 are provided so as each to intersect with all of the column conductors 162. The column conductors 162 and the row conductors 164 together form a programmable matrix indicated generally at 166. A user programs the array 166 by making connections at selected intersections between the column conductors 162 and row conductors 164.

Each of the row conductors 164 terminates in one of a group of AND gates 168. Groups 168 of the AND gates have outputs connected to the input of respective OR gates 170. The output of each OR gate 170 is connected to the D input of a latch 172. A latch enable signal is brought in on a line 174, passes through a buffer 176 and is connected to the L input of each latch 172. Upon the enabling of each latch 172, the value stored therein is reflected in its true formed at a Q output thereof, and its complement formed at a $\overline{Q}$ output. Each $\overline{Q}$ output is fed back into the matrix 166 through a respective buffer 178, which once again outputs a true and a complement form of the $\overline{Q}$ back into the array. These feedbacks can be used for further logic functions.

Figure 2:
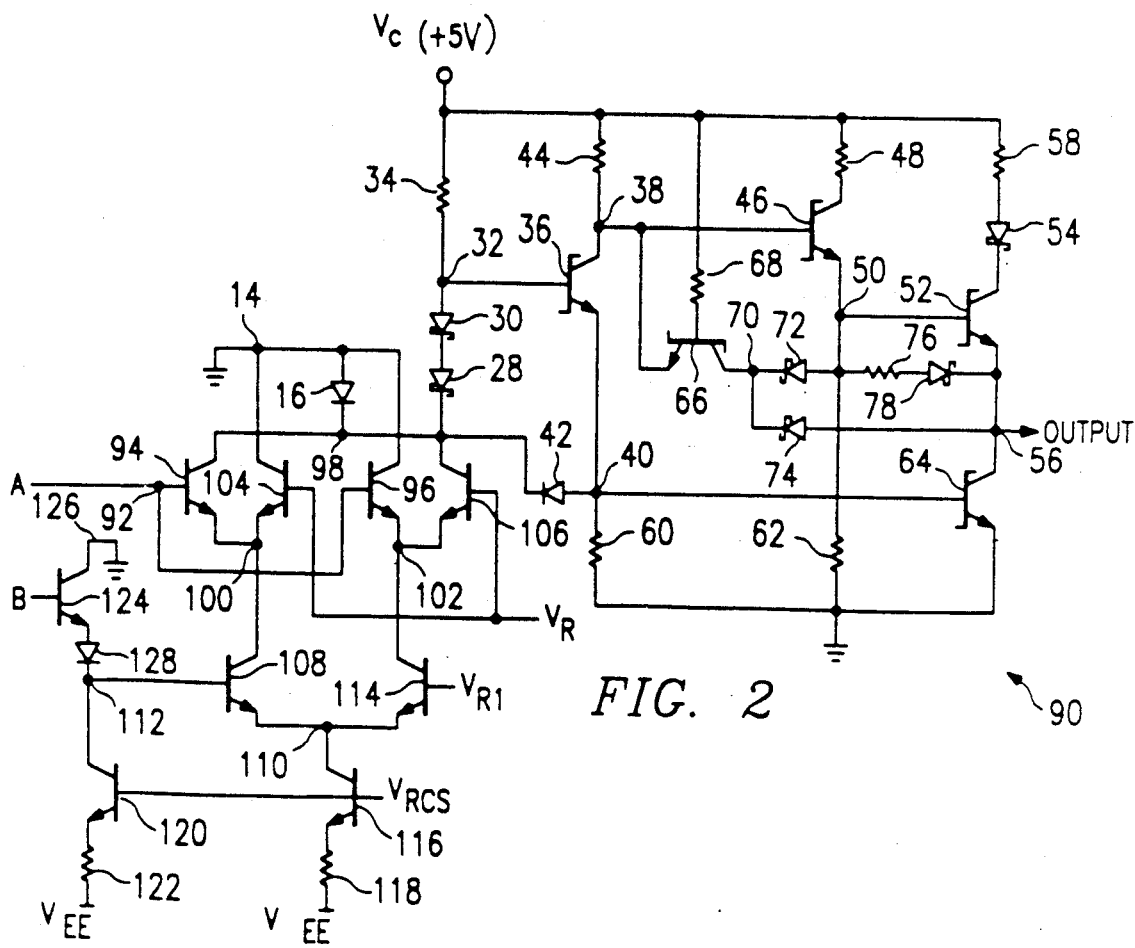
FIG. 2 is an electrical schematic diagram of a second true ECL to true TTL conversion circuit according to the invention, particularly incorporating an XOR or polarity switch.

The circuit shown in FIG. 2 is represented by the dashed enclosure indicated at 90 in FIG. 3. As can be shown, the circuit 90 incorporates a logic XOR gate 180 that has a first input thereof connected to the Q output of the respective latch 172, and a second input thereof which may programmably be connected to $V_{CCECL}$ (ground in the illustrated embodiment). The second input serves as the polarity switch described in more detail above in conjunction with FIG. 2.

The ECL to TTL translation is performed within the logic inverter 182 of each ECL/TTL translation circuit 90. Although not shown in FIG. 2, each of the logic inverters 182 (comprising in FIG. 2 all of the circuitry after node 32) may be provided with an output enable signal on a line 184. The source of the output enable line 184 is the output of a TTL to converter/ECL inverter 186.

As can be seen, a combination PAL and TTL/ECL translation circuit has been shown and described. This combination circuit allows for the easy connection between ECL and TTL circuits and provides a large amount of "glue" logic capability.

In summary, an ECL to TTL conversion circuit has been provided that turns a true ECL signal into a true TTL signal with TTL output levels that are closely referenced to the TTL high and low voltage supply levels. This novel TTL to ECL conversion circuit may be advantageously employed in a PAL integrated circuit to provide an interface circuit between ECL and TTL logic functions.

While several embodiments of the present invention and their advantages have been described in the above detailed description, the invention is not limited thereto but only by the scope and spirit of the appended claims.

What is claimed is:

1. A circuit for converting an ECL signal to TTL signal, comprising:
   an ECL input for receiving a binary ECL signal, said ECL signal consisting of a sequence of portions at a high ECL voltage level and portions at a low ECL voltage level;
   a TTL high supply voltage input;
   a TTL low supply voltage input;
   an output, said circuit producing a high TTL voltage level referenced to the level of said TTL high supply voltage on said output in response to a preselected one of said high and low ECL voltage levels on said ECL input, said circuit producing a low TTL voltage level referenced to the level of said TTL low supply voltage on said output in response to receiving the other of said high and low ECL voltage levels on said ECL input; and
   a polarity switch operable to receive a polarity signal having a high and low values for reversibly preselecting said one of said high and low ECL voltage levels and said other of said high and low ECL voltage levels.

2. The circuit of claim 1, and further comprising an output transistor coupled to said output for producing said low TTL voltage level, said output transistor having a collector-emitter voltage, said low TTL voltage level being above said TTL low supply voltage by said collector-emitter voltage.

3. The circuit of claim 1, and further comprising two output transistors for selectively coupling said TTL high supply voltage input to said output, each of said output transistors having a base-emitter voltage, said high TTL voltage level on said output being below said TTL high supply voltage by slightly more than the sum of said base-emitter voltages.

4. A programmable array logic circuit having a plurality of true ECL inputs and a plurality of true TTL outputs formed on an integrated circuit chip, comprising:
   a programmable array logic matrix comprising a plurality of column conductors and a plurality of row conductors formed so as to intersect said column conductors, each true ECL input coupled to a respective one of said column conductors, a plurality of boolean logic gate circuits each having inputs coupled to a respective group of said row conductors, said matrix programmable by causing connections to be made at selected intersections of said row and column conductors;
   a plurality of ECL/TTL translation circuits, logical outputs of said boolean logic gate circuits coupled to respective inputs of said translation circuits for receiving respective logical ECL output signals each comprising a sequence of high and low ECL voltage levels;
   each ECL/TTL translation circuit operable to convert a high ECL voltage level of said logical ECL signal to a preselected one of a true high TTL voltage level and a true low TTL voltage level, and operable to convert a low ECL voltage level of said logical ECL signal to the other of said true high and low TTL voltage levels, said TTL voltage levels together forming a true TTL output signal, each said ECL/TTL translation circuit connected to high and low TTL voltage supplies, said true high TTL voltage level referenced to the voltage level of said high TTL voltage supply, said true low TTL voltage level referenced to the voltage level of said low TTL voltage supply; and
   wherein each said ECL/TTL translation circuit includes a polarity switch operable to receive a polarity signal having high and low values for reversibly preselecting said preselected one of said true high TTL voltage level and said true low TTL voltage level and said other of said true high and low TTL voltage level.

5. The programmable array logic circuit of claim 4, and further comprising a plurality of latches each coupling an output of a respective boolean logic gate circuit to a respective input of said ECL/TTL translation circuit.

6. The programmable array logic circuit of claim 4, wherein each of said ECL/TTL translation circuits comprises:
   a differential circuit for receiving an ECL signal consisting of a sequence of high and low values and producing a differential signal in response thereto having a sequence of high values and low values, said high value of said differential signal produced in response to one of said high and low values of said ECL signal, said low value of said differential signal produced in response to the other of said high and low values of said ECL signal;
   a first translator circuit having an input coupled to said differential circuit for receiving said differential signal and an output, a TTL low supply voltage coupled to said first transistor circuit, said first translator circuit producing on its output a low TTL output signal having a voltage level referenced to the voltage level of said TTL low supply voltage in response to receiving said high value of said differential signal;
   a second translator circuit having an input, an input signal appearing on said input of said second translator circuit having a voltage level related to the voltage level of said differential signal, a first transistor of said second translator circuit having a base connected to said input of said second translator circuit, a collector of said first transistor coupled to said TTL high supply voltage, and an emitter, a second transistor of said second translator circuit having a collector coupled to a supply voltage, a base connected to said emitter of said first transistor, and an emitter connected to said output, a third transistor of said second translator circuit having a base coupled to a supply voltage, an emitter coupled to said base of said first transistor, a collector of said third transistor coupled to said output.

7. A method for converting a true ECL signal to a true TTL signal, comprising the steps of:
   producing a differential signal in response to a true ECL signal having a sequence of high and low values, a high value of the differential signal produced in response to one of said high and low values, a low value of the differential signal produced in response to the other of the high and low values;
   inputting a plurality signal for selecting one of the high and low values of the true ECL signal that will produce a high value of the differential signal;

transmitting a high value of the true ECL signal to a first translator circuit;

outputting a true low TTL output signal having a voltage level referenced to the voltage level of a TTL low voltage supply from the first translator circuit in response to the first translator circuit receiving the high value of the differential signal;

producing a response to said low value of said differential signal an internal input signal having a voltage level related to the low voltage level of the differential signal;

transmitting the internal input signal to a second translator circuit; and outputting a true high TTL output signal having a voltage level referenced to the voltage level of a TTL high supply voltage by the second translator circuit in response to the differential signal having a low value.

8. A circuit for converting a true ECL signal to a true TTL signal, comprising:

a differential circuit for receiving an ECL signal consisting of a sequence of high and low values and producing a differential signal in response thereto having a sequence of high values and low values, said high value of said differential signal produced in response to one of said high and low values of said ECL signal, said low value of said differential signal produced in response to the other of said high and low values of said ECL signal;

a first translator circuit having an input coupled to said differential circuit for receiving said differential signal and an output, a TTL low supply voltage coupled to said first translator circuit, a first transistor of said first translator circuit having a base coupled to said input of said of said first translator circuit, a collector of said first transistor coupled to a TTL high supply voltage, said first transistor having an emitter, a second transistor of said first translator circuit having a base connected to said emitter of said first transistor, an emitter of said second transistor coupled to said low TTL supply voltage, a collector of said second transistor coupled to said output, a third transistor of said second translator circuit having a base coupled to a supply voltage source, a collector of said third transistor coupled to said output, an emitter of said third transistor coupled to said collector of said first transistor;

a second translator circuit having an input, an input signal appearing on said input of said second translator circuit having a voltage level related to the voltage level of said differential signal, a first transistor of said second translator circuit having a base connected to said input of said second translator circuit, a collector of said first transistor coupled to a TTL high supply voltage, and an emitter, a second transistor of said second translator circuit having a collector coupled to a supply voltage, a base connected to said emitter of said first transistor and said collector of said first transistor of said first translator circuit, and an emitter connected to said output, a third transistor of said second translator circuit having a base coupled to a supply voltage, an emitter coupled to said base of said first transistor of said second translator circuit, a collector of said third transistor coupled to said output.

9. The circuit of claim 8, wherein said first translator circuit comprises a first transistor having a base coupled to said input of said first translator circuit, a collector coupled to a supply voltage, and an emitter;

a second transistor having a base coupled to said emitter of said first transistor, an emitter of said second transistor coupled to said TTL low supply voltage, a collector of said second transistor coupled to said output;

a current path defined between said collector and said emitter of said second transistor, a high voltage level received on the base of said first transistor rendering said current path conductive such that the voltage level of said output will be close to the level of said TTL low voltage level.

10. The circuit of claim 9, wherein the difference between the voltage level of the output and the TTL low voltage level is equal to the collector-emitter voltage of said second transistor when said second transistor is rendered conductive.

11. The circuit of claim 10, wherein said collector-emitter voltage is approximately 0.2 volts.

12. The circuit of claim 8, wherein said input signal appearing on said input of said second translator circuit is high when said differential signal is low.

13. The circuit of claim 8, and further comprising a first transistor of said first translator circuit, a collector of said first transistor of said firs translator circuit coupled to said base of said first transistor of said second translator circuit, a base of said first transistor of said first translator circuit receiving said differential signal, and an emitter of said first transistor of said first translator circuit coupled to a supply voltage substantially lower than said TTL high supply voltage for rendering the voltage level of said input signal low when the level of said differential signal is high.

14. The circuit of claim 8, wherein the difference between said TTL high voltage supply level and the voltage level at said output is approximately the sum of the base-emitter voltage of said first transistor and the base-emitter voltage of said second transistor when both said first and second transistors are operating.

15. The circuit of claim 8, and further comprising a diode unidirectionally coupling the emitter of said first transistor with the collector of said third transistor, a current path through said diode and including the collectors and emitters of said first and third transistors providing a current sinking path to said TTL low supply voltage to enhance the switching speed of said first transistor.

16. The circuit of claim 8, and further comprising a diode unidirectionally coupling the collector of said third transistor with the emitter of said second transistor, a current path through said diode and including the collectors and emitters of said first and third transistors providing a current sinking path to said TTL low supply voltage to enhance the switching speed of said first transistor.

17. The circuit of claim 8, wherein said differential circuit has a polarity input for receiving a polarity signal having either a high or a low value, a high value of said polarity signal selecting said one of said high and low values of said true ECL signal for producing a high value of said differential signal, a low value of said polarity signal selecting the other of said high and low values of said true ECL signal for producing a high value of said differential signal.

18. The circuit of claim 8, wherein said TTL high supply voltage supply si approximately five volts and said TTL low voltage supply is approximately zero volts.

* * * * *